United States Patent
Andreev et al.

(10) Patent No.: US 7,210,113 B2
(45) Date of Patent: Apr. 24, 2007

(54) PROCESS AND APPARATUS FOR PLACING CELLS IN AN IC FLOORPLAN

(75) Inventors: Alexander E. Andreev, San Jose, CA (US); Andrey A. Nikitin, Moscow (RU); Igor A. Vikhliantsev, Sunnyvale, CA (US)

(73) Assignee: LSI Logic Corporation, Milpitas, CA (US)

( * ) Notice: Subject to any disclaimer, the term of this patent is extended or adjusted under 35 U.S.C. 154(b) by 359 days.

(21) Appl. No.: 10/830,542

(22) Filed: Apr. 23, 2004

(65) Prior Publication Data

US 2005/0240889 A1 Oct. 27, 2005

(51) Int. Cl.
G06F 17/50 (2006.01)

(52) U.S. Cl. .......................................... 716/10; 716/7
(58) Field of Classification Search ............... 716/1–21
See application file for complete search history.

(56) References Cited

U.S. PATENT DOCUMENTS

| | | | | |
|---|---|---|---|---|
| 5,225,991 A * | 7/1993 | Dougherty | ...................... | 716/9 |
| 5,535,134 A * | 7/1996 | Cohn et al. | ...................... | 716/8 |
| 5,661,663 A * | 8/1997 | Scepanovic et al. | ........... | 716/8 |
| 5,682,321 A * | 10/1997 | Ding et al. | ...................... | 716/8 |
| 5,712,793 A * | 1/1998 | Scepanovic et al. | .......... | 716/12 |
| 5,838,583 A * | 11/1998 | Varadarajan et al. | ........... | 716/9 |
| 5,867,398 A * | 2/1999 | Scepanovic et al. | ........... | 716/9 |
| 5,870,312 A * | 2/1999 | Scepanovic et al. | .......... | 716/10 |
| 5,892,688 A * | 4/1999 | Scepanovic et al. | ........... | 716/2 |
| 5,971,588 A * | 10/1999 | Scepanovic et al. | ........ | 700/121 |
| 6,249,902 B1 * | 6/2001 | Igusa et al. | .................. | 716/10 |
| 6,282,693 B1 * | 8/2001 | Naylor et al. | .................. | 716/8 |
| 6,292,929 B2 * | 9/2001 | Scepanovic et al. | .......... | 716/14 |
| 6,415,425 B1 * | 7/2002 | Chaudhary et al. | ............ | 716/9 |
| 6,480,991 B1 * | 11/2002 | Cho et al. | ...................... | 716/8 |
| 6,536,028 B1 * | 3/2003 | Katsioulas et al. | ........... | 716/17 |
| 6,567,967 B2 * | 5/2003 | Greidinger et al. | ........... | 716/10 |
| 6,748,574 B2 * | 6/2004 | Sasagawa et al. | ............. | 716/9 |
| 7,036,102 B2 * | 4/2006 | Andreev et al. | ............... | 716/7 |

OTHER PUBLICATIONS

U.S. Appl. No. 10/688,460, filed Oct. 17, 2003, Process and Apparatus for Fast Assignment of Objects to a Rectangle (22 pages).
U.S. Appl. No. 10/694,208, filed Oct. 27, 2003, Process and Apparatus for Placement of Cells in an IC During Floorplan Creation (26 pages).

* cited by examiner

*Primary Examiner*—Leigh M. Garbowski
(74) *Attorney, Agent, or Firm*—Westerman, Champlin & Kelly

(57) ABSTRACT

Cells are placed into an integrated circuit floorplan by creating clusters of cells in modules, each cluster being composed of cells in a path connected to at least one flip-flop in the module, or of cells that are not in a path connected to any flip-flop. Regions are defined in the floorplan for placement of modules, and the clusters are placed into optimal locations in modules and placing the modules into optimal locations in the regions. The coordinates for the wires, modules and clusters are selectively recalculated. The clusters are moved in the floorplan for more uniform density, and the modules are assigned to regions based on module coordinates.

18 Claims, 3 Drawing Sheets

PROCESS AND APPARATUS FOR PLACING CELLS IN AN IC FLOORPLAN

CROSS-REFERENCE TO RELATED APPLICATION

The present application is related to application Ser. No. 10/694,208 filed Oct. 27, 2003 for "Process and Apparatus for Placement of Cells in an IC During Floorplan Creation" by Alexander E. Andreev, Andrey A. Nikitin and Igor A. Vikhliantsev and assigned to the same assignee as the present invention, the content of which is hereby incorporated by reference in its entirety.

FIELD OF THE INVENTION

This invention relates to the design of integrated circuits (ICs) and particularly to the placement of standard cells during a floorplan creation.

BACKGROUND OF THE INVENTION

The placement of cells in an IC chip design during development can be summarized as encompassing four stages: During a first stage, the size of the chip is selected, and during a second stage the I/O (input/output) cells are placed. The I/O cells are the cells having pins that connect the chip to the outside world. During a third stage, placement of megacells (such as memories, large blocks of cells, etc.) is accomplished. The fourth stage comprises the placement of standard cells, such as logic cells, flip-flops, latches, etc.

Integrated circuits are used in a wide range electronic devices produced by a large number of device manufacturers. In practice, ICs are seldom manufactured (fabricated) by the electronic device manufacturer. Instead ICs are manufactured by an IC foundry to the specifications of the electronic device manufacturer. The design of the IC is usually the result of corroboration between the device manufacturer and the IC foundry. The first stage of choosing the size of the chip is usually performed by the device manufacturer so that the chip fits within the electronic device. The second stage of placement of I/O cells is also often performed by the device manufacturer, usually in close corroboration with the foundry, to meet the requirements of device form, fit and function. The third and fourth stages are performed by an IC developer, usually to meet the foundry's processes. In most cases the developer first places the megacells and then finishes the process of chip design by placing other cells using computer tools, usually supplied by the foundry.

The third stage, namely megacell placement, is the subject of the above-identified Andreev et al. application. The fourth stage, the placement of standard cells, is the subject of the present invention.

Consider a chip with a given outline and which contains only I/O cells, megacells (such as memories, large blocks of cells, etc.), and standard cells (namely logic cells and flip-flops). Assume further that the I/O cells and megacells have already been placed, such that their coordinates are fixed. Thus, the first three stages of the floorplan have been completed. As shown in FIG. 1, the layout of such a partially completed chip floorplan 10 includes I/O cells 12 and megacells 14, defining regions 16 where standard cells may be placed. Regions 16 can be characterized as composed of rectangular regions $REG_1, REG_2, \ldots, REG_M$, where $M \geq 1$).

Consider that N standard cell modules are to be placed into regions $REG_1, REG_2, \ldots, REG_M$, where $N \geq 1$, and that some standard cells belong to one of the standard cell modules $MOD_1, MOD_2, \ldots, MOD_N$, whereas other standard cells do not belong to any standard cell module. The problem addressed by the present invention is the placement of each standard cell module $MOD_i$ ($1 \leq i \leq N$) into some region $REG_{PLACE(i)}$ where $1 \leq place(i) \leq M$, such that a) the total area of the standard cell modules placed in any region is not more than the area of the region, and b) timing restrictions are accounted for.

The present invention is particularly useful for floorplan development of chips using technology that segments total chip area into regions of various types, such as regions for placement of megacells and I/O cells and regions for placement of standard cells. Examples of such technology include RapidChip® technology available from LSI Logic Corporation or/and FPGA.

SUMMARY OF THE INVENTION

In accordance with one embodiment of the invention, cells are placed into an integrated circuit floorplan by creating clusters of cells in modules. Each cluster is composed of cells in a path connected to at least one flip-flop in the module, or of cells that are not in a path connected to any flip-flop. Regions are defined in the floorplan for placement of modules. The clusters are placed into optimal locations in modules and the modules are placed into optimal locations in the regions.

In some embodiments, the coordinates for wires connecting the clusters, for modules based on clusters coordinates, and for clusters based on wire and module coordinates, are iteratively recalculated. The clusters are moved in the floorplan for more uniform density. The modules are then assigned to regions based on module coordinates.

DETAILED DESCRIPTION OF THE PREFERRED EMBODIMENTS

Figure 2:
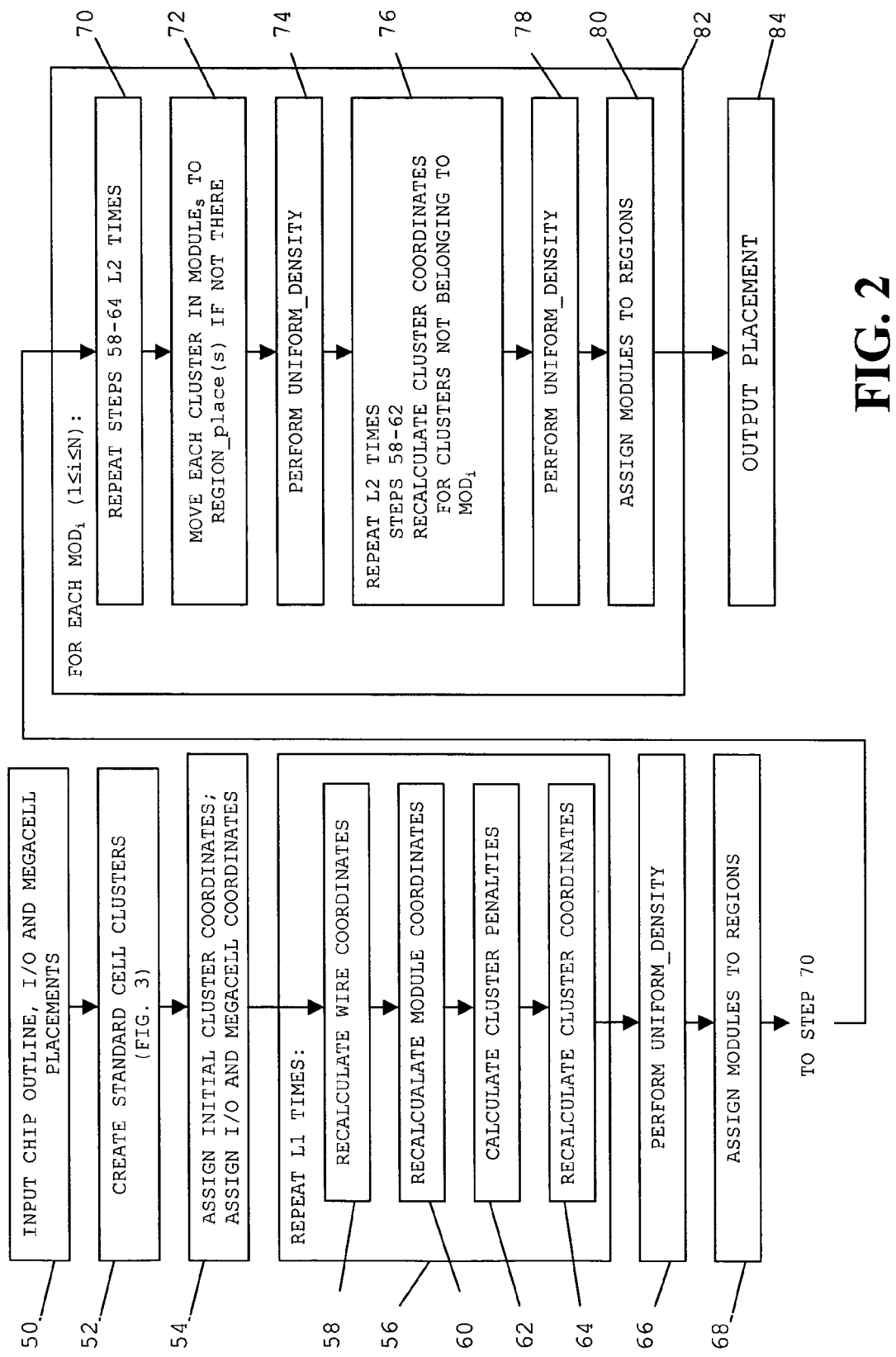
FIGS. 2 and 3 are flowcharts illustrating processes employed to place standard cells in a floorplan of a chip.

FIG. 2 is a flowchart of the process of placing standard cells into a chip floorplan in accordance with an embodiment of the present invention.

At step 50, the chip parameters defining the bounds of the chip, the I/O cells and the megacells are input to the process. Conveniently, the process may be carried out using a computer or data processor that has been programmed to perform the process of FIG. 2. Also conveniently, the placement of the megacells may have already been accomplished through a computer process as described in the aforementioned Andreev et al. application, in which case the definition of the chip, I/O cells and megacells are already present in the computer.

At step 52 clusters of standard cells are created. The present embodiment avoids consideration of the individual standard cells, but instead considers clusters of the cells. The cluster is some set of standard cells, the pins of which are the pins of all the cells belonging to the cluster. The process is accelerated by dealing with clusters rather than separate standard cells. The process of clusterization is similar to one described in the aforementioned Andreev et al. application, except that here the clusterization process considers the modules to which the cells are assigned. Thus, cells of different modules are not unified to the same cluster. One embodiment of a process for creating clusters of standard cells is shown in the flowchart of FIG. 3.

Figure 3:
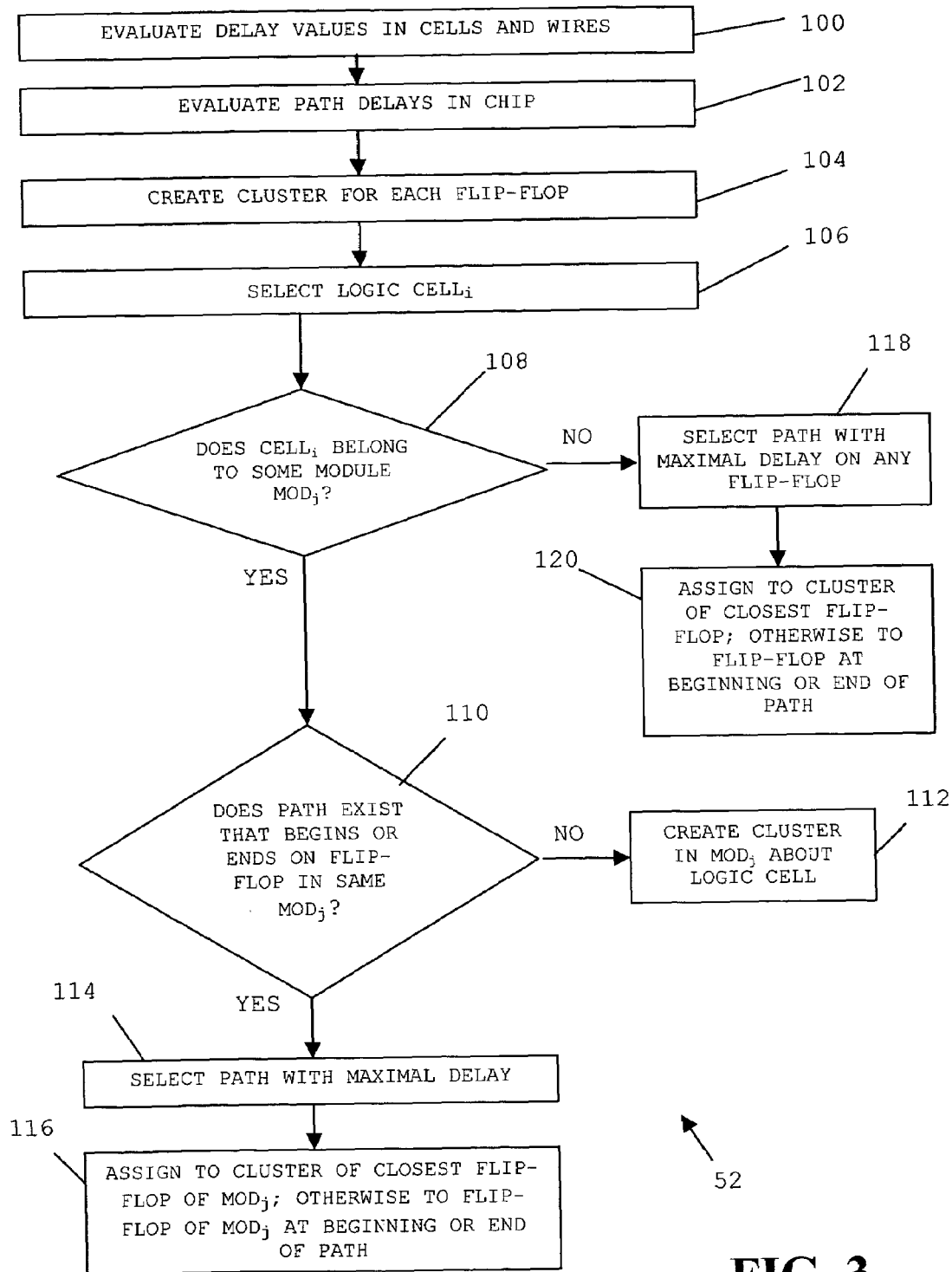

As shown in FIG. 3, at step 100 the values of delays of cells and wires of the chip are evaluated for the average case. At this point in the process, cell placement has not yet been accomplished. Therefore, no wire length is yet known. It is therefore not possible to precisely evaluate the path delays of cells and wires without wire length. Therefore, at step 102, path delays are evaluated using average delays of the cells and average lengths of wires. These average delays are applied to all the paths of the chip.

For example, if $cell_1$ and $cell_2$ are standard cells of the chip belonging to standard cell modules $MOD_i$ and $MOD_j$, respectively, T is the maximal value of the delay of the chip path containing both $cell_1$ and $cell_2$. If the value T is greater than the required delay value or if it is close to the required delay value, the length of that lie on the paths connecting $cell_1$ and $cell_2$ must be reduced. Consequently, it would be necessary that modules $MOD_i$ and $MOD_j$ be placed in the same region or in neighboring regions of the chip. Conversely, if the value T is much less than the required delay value, there is greater freedom in placing modules $MOD_i$ and $MOD_j$, and the two modules may be placed more distal to each other.

At step 104, a cluster is created for each flip-flop, and at step 106 a logic cell, $CELL_i$, is selected. $CELL_i$ may or may not be in module $MOD_j$. At step 108, if $CELL_i$ belongs to some module $MOD_j$, the process continues to step 110. At step 110, all paths p1, p2, . . . are examined that contain $CELL_i$ and terminate (begin and/or end) on a flip-flop in the same module $MOD_j$. If no such path exists that begins or ends on a flip-flop in $MOD_j$, the process of step 52 ends at step 112 and a new cluster is created in $MOD_j$ about $CELL_i$. If a path is found that includes $CELL_i$ and begins and/or ends on a flip-flop in $MOD_j$ the process continues to step 114.

At step 114, the path p with the maximal delay that begins and/or ends on a flip-flop in $MOD_j$ is selected. At step 116, if there is only one terminating flip-flop in $MOD_j$, forming either the beginning or the end of the path for $CELL_i$, $CELL_i$ is assigned to the cluster of that flip-flop in $MOD_j$. If the path includes flip-flops in $MOD_j$ at both the beginning and end of the path, $CELL_i$ is assigned to the flip-flop that is "closest" to the logic cell. In either case, step 114 results in $CELL_i$ being assigned to a cluster of a flip-flop in $MOD_j$.

A given flip-flop is "closest" to a logic cell if the value of the delay of the path fragment between the logic cell and the given flip-flop is smaller than the value of the delay of the path fragment between logic cell and the other flip-flop.

If at step 108, $CELL_i$ does not belong to any module, then at step 118 all paths containing $CELL_i$ and terminating on a flip-flop are examined, and the path p with the maximal delay that begins and/or end on a flip-flop in any module is selected. At step 120, $CELL_i$ is assigned to the module and cluster containing the flip-flop that is "closest" to the logic cell on the path of maximal delay. If the path has only one flip-flop, at either the beginning or end, $CELL_i$ is assigned to the cluster of that flip-flop, in that flip-flop's module. If the path to and from the logic cell begins and ends on flip-flops, $CELL_i$ is assigned to the cluster of the flip-flop closest to the cell, as previously described, in that flip-flop's module. Thus, step 116 results in previously unassigned $CELL_i$ being assigned to the cluster of a flip-flop in some module.

It will be appreciated that a cluster of standard cells cannot contain two cells of different modules. Consequently, a cluster belongs to a given module if and only if the cluster contains some cell of that module.

Figure 1:
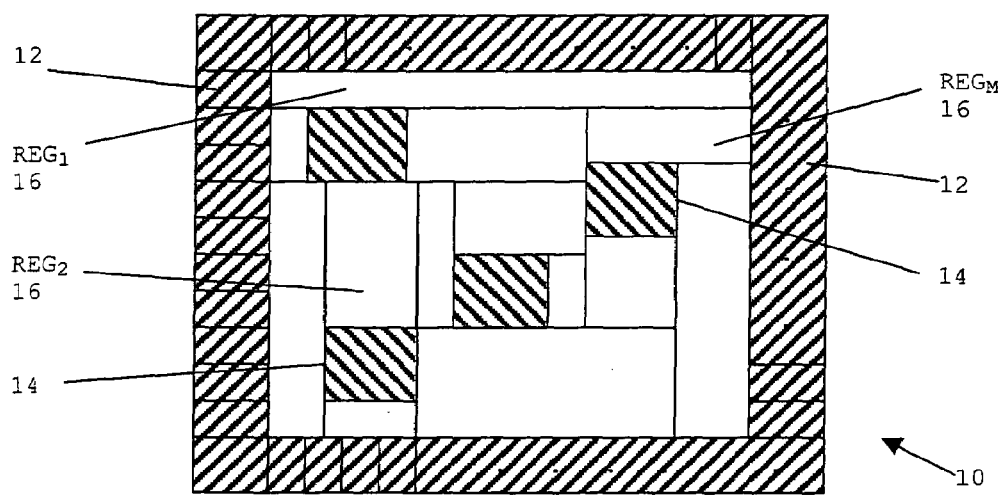
FIG. 1 illustrates a partial chip floorplan, useful for explaining the environment of the present invention.

Returning to the flowchart of FIG. 2, coordinates are assigned to the I/O cells and megacells at step 54. The coordinates of the I/O cells and megacells are fixed and will not change. Thus, before assignment of coordinates to the clusters, the layout appears as shown in FIG. 1.

Also at step 54, all of the clusters are initially assigned coordinates at the center of the chip without regard to the presence of megacells.

Step 56 is an iterative subprocess that includes steps 58, 60, 62 and 64 to recalculate cluster coordinates and thus re-position the clusters to more favorable positions.

At step 58, the wire coordinates are recalculated in accordance with the current coordinates of the I/O cells, megacells and clusters whose pins are connected to the wire. Assume W is some wire and $C_1, C_2, \ldots, C_q$ ($q \geq 1$) are the I/O cells, megacells and clusters whose pins are connected to wire W. The coordinates of the respective I/O cell, megacell or cluster $C_i$ are $x_i, y_i$. The new coordinates for wire W are recalculated as:

$$x = \frac{1}{q}\sum_{i=1}^{q} x_i; \quad y = \frac{1}{q}\sum_{i=1}^{q} y_i,$$

where q is the number of I/O cells, megacells and clusters connected to the wire. It will be appreciated that the new x,y coordinates for the wire are based on the optimal placement of the wire for all connecting cells, megacells and clusters.

With wire coordinates re-calculated, the module coordinates are then re-calculated at step 60. This procedure recalculates the coordinates of standard cell modules in accordance with the current coordinates of the clusters belonging to these modules. Consider some module $MOD_j$ and clusters $C_1, C_2, \ldots, C_k$ ($k \geq 1$) are the clusters belonging to module $MOD_j$. The coordinates of cluster $C_i$ are $x_i, y_i$, and the new coordinates of module $MOD_j$ are recalculated as:

$$x = \frac{1}{k}\sum_{i=1}^{k} x_i; \quad y = \frac{1}{k}\sum_{i=1}^{k} y_i.$$

At step 62 cluster penalties are calculated. Consider that (a,b) are the coordinates of a cluster $C_i$ that belongs to a module $MOD_j$ having coordinates (c,d). The square distance $D_{i,j}$ between cluster $C_i$ and module $MOD_j$ is $D_{i,j}=(a-c)^2+(b-d)^2$. $D_j$ is the maximal square distance between the module $MOD_j$ and a cluster of this module, $D_j=\max_i(D_{i,j})$. The penalty of a cluster $C_i$ is the ratio of the square distance of the cluster to the maximal square distance of the module: $P_i=D_{i,j}/D_j$. If cluster $C_i$ does not belong to any module its penalty $P_i$ is zero by default, $P_i=0$.

At step 64, the cluster coordinates are recalculated based on the current coordinates of wires connected to the cluster pins and the coordinates of the module MOD of the cluster. Consider a cluster C and wires $W_1, W_2, \ldots, W_r$ ($r \geq 1$) connected to the pins of cluster C. MOD is the module of the cluster C (if this module exists). P is the penalty of the cluster C. Let $(x_i, y_i)$ be the coordinates of wire $W_i$, $DEL_i$ be the maximal value of delay of the chip path that contains wire $W_i$ and (xm,ym) are the coordinates of the module MOD. If module MOD does not exist, xm=ym=0. The new coordinates of cluster C are recalculated as:

$$x = \frac{1}{P+1}\left(P \cdot xm + \frac{1}{\sum_{i=1}^{r} DEL_{i'}} \sum_{i=1}^{r}(DEL_{i'} \cdot x_i)\right);$$

$$y = \frac{1}{P+1}\left(P \cdot ym + \frac{1}{\sum_{i=1}^{r} DEL_{i'}} \sum_{i=1}^{r}(DEL_{i'} \cdot y_i)\right).$$

The adjustment of the cluster coordinates at step 64 places the cluster to a more optimal position on the chip. However, better results can be obtained by following step 64 with a recalculation of wire and module coordinates as in steps 58 and 60, followed by recalculation of coordinate coordinates as in step 64 based on the penalties for the recalculated wire and module coordinates. For this reason, it is preferred to iteratively repeat steps 58–64 some number of times, designated L1 number of iterations. While the number L1 of iterations is arbitrary, we have found good results where L1=30.

After completing the subprocess 56 L1 number of times, it is necessary to resolve certain conflicts among the clusters. These conflicts may be of the following types:

some clusters are moved to the point of the chip that does not lie in any region; or the total area of the clusters that are moved to one region exceeds the area of this region.

To remove these conflicts a procedure, called UNIFORM_DENSITY( ) is applied to the total chip outline. This procedure adjusts the density of clusters on the chip and is more fully explained in the aforementioned Andreev et al. application, particularly at FIGS. 4 and 5 and the accompanying text thereof, which is herein incorporated by reference. At step 66, the density of the clusters is adjusted as described in the Andreev et al. application.

At step 68, the modules are assigned to regions. This procedure examines all the modules. For each examined module MOD$_i$ (1≦i≦N) a region REG$_j$ (1≦j≦M) is found that contains the largest number of module clusters. A place (i)=j is assigned to the module and each cluster C that belongs to module MOD$_i$ and is not in region REG$_j$ is assigned to the region. More particularly, if cluster C is already in region REG$_j$, no action is necessary; if cluster C not in region REG$_j$, the coordinates for cluster C are changed to place the cluster inside region REG$_j$.

At step 70, steps 58–64 of recalculating the cluster coordinates are iteratively repeated L2 times. As in the case of number L1, while the number of iterations L2 is arbitrary, we have found good results where L2=10. Following step 70, at step 72 the coordinates of each cluster belonging to a module MOD$_s$ are changed to place the cluster into REGION_place(s). At step 74, the UNIFORM_DENSITY procedure is applied to the entire chip outline, and at step 76 an iterative process is repeated L2 number of times to recalculate wire and module coordinates and calculate cluster penalties, as in steps 58–62, followed by recalculation of cluster coordinates for all clusters that do not belong to the examined module MOD$_i$ in a manner similar to that described for step 64, except that it is performed on a module-by-module basis.

At step 78, the UNIFORM_DENSITY procedure is again performed on the entire chip outline, following which at step 80 the modules are assigned to the regions as described in connection with step 68.

As shown at block 82, steps 70–80 are performed for each module MOD$_i$ (1≦i≦N) to derive the placement for that module. Then at step 84, the placement is output as the modules place(i) (1≦i≦N).

The present invention thus provides an effective technique for placing cells into a floorplan, such as for an IC platform, which is useful following the placement of I/O and megacells. The technique is fast, efficient and makes chip design more cost efficient.

Although the present invention has been described with reference to preferred embodiments, workers skilled in the art will recognize that changes may be made in form and detail without departing from the spirit and scope of the invention.

What is claimed is:

1. A process of placing cells into an integrated circuit floorplan comprising steps of:
    a) creating clusters of cells in modules, each cluster comprising cells in a path connected to at least one flip-flop in the module, or of cells that are not in a path connected to any flip-flop;
    b) defining regions of the floorplan for placement of modules; and
    c) placing the clusters into locations in modules, placing the modules into locations in the regions, and selectively recalculating coordinates for clusters based on wire and module coordinates, comprising:
    calculating a cluster penalty based on a square distance between a cluster's coordinates and its module's coordinates, and
    recalculating cluster coordinates based on the existing cluster and module coordinates, the cluster penalty, a delay associated with each wire connected to the cluster and that wire's coordinates.

2. The process of claim 1, wherein step c) further comprises: selectively performing steps of recalculating coordinates for wires connecting the clusters and for modules based on clusters coordinates,
    moving clusters in the floorplan for more uniform density, and
    assigning the modules to regions based on module coordinates.

3. The process of claim 2, wherein the step of recalculating wire coordinates is performed by executing the following relationship q times $$x = \frac{1}{q}\sum_{i=1}^{q} x_i; \quad y = \frac{1}{q}\sum_{i=1}^{q} y_i,$$

where (x,y) are the recalculated wire coordinates, q is the number of I/O cells, megacells and clusters connected to the wire and (x$_i$,y$_i$) are the coordinates of the respective I/O cells, megacells and clusters connected to the wire.

4. The process of claim 2, wherein the step of recalculating module coordinates is performed by executing the following relationship k times $$x = \frac{1}{k}\sum_{i=1}^{k} x_i; \quad y = \frac{1}{k}\sum_{i=1}^{k} y_i,$$

where (x,y) are the recalculated module coordinates, k is the number of clusters belonging to the module and $(X_i,y_i)$ are the coordinates of respective clusters belonging to the module.

5. The process of claim 2, wherein step c) further comprises, for each module:
   selectively performing steps of recalculating coordinates for wires connecting the clusters, for modules based on clusters coordinates, and for clusters based on wire and module coordinates,
   moving clusters in the floorplan for more uniform density, and
   re-assigning the modules to regions based on module coordinates.

6. The process of claim 5, wherein the step of recalculating wire coordinates is performed by executing the following relationship q times $$x = \frac{1}{q}\sum_{i=1}^{q} x_i; \quad y = \frac{1}{q}\sum_{i=1}^{q} y_i,$$

where (x,y) are the recalculated wire coordinates, q is the number of I/O cells, megacells and clusters connected to the wire and $(x_i,y_i)$ are the coordinates of the respective I/O cells, megacells and clusters connected to the wire.

7. The process of claim 5, wherein the step of recalculating module coordinates is performed by executing the following relationship k times $$x = \frac{1}{k}\sum_{i=1}^{k} x_i; \quad y = \frac{1}{k}\sum_{i=1}^{k} y_i,$$

where (x,y) are the recalculated module coordinates, k is the number of clusters belonging to the module and $(x_i,y_i)$ are the coordinates of respective clusters belonging to the module.

8. The process of claim 5, wherein the cluster penalty for a cluster under consideration is based on a ratio of the square distance, $D_{ij}$, between that cluster's coordinates and the module's coordinates and a maximal square distance, $D_j=\max D_{ij}$, a cluster with maximal square distance to the module's coordinates.

9. The process of claim 1, wherein the step of recalculating cluster coordinates is performed by executing the following relationship r times $$x = \frac{1}{P+1}\left(P \cdot xm + \frac{1}{\sum_{i=1}^{r} DEL_{i'}}\sum_{i=1}^{r}(DEL_{i'} \cdot x_i)\right);$$

$$y = \frac{1}{P+1}\left(P \cdot ym + \frac{1}{\sum_{i=1}^{r} DEL_{i'}}\sum_{i=1}^{r}(DEL_{i'} \cdot y_i)\right),$$

were (x,y) are the recalculated cluster coordinates, (xm,ym) are the coordinates of the cluster's module, P is a cluster penalty based on a square distance between the cluster's coordinates and its module's coordinates, $(x_i,y_i)$ are the coordinates of a wire $W_i$ connected to a pin of the cluster, $DEL_j$ is the maximal delay of the path that connects wire $W_r$ to coordinates (xm,ym) and r is the number of wires connected to the module.

10. The process of claim 1, wherein the cluster penalty for a cluster under consideration is based on a ratio of the square distance, $D_{ij}$, between that cluster's coordinates and the module's coordinates and a maximal square distance, $D_j=\max D_{ij}$, a cluster with maximal square distance to the module's coordinates.

11. The process of claim 1, wherein step (c) is performed by:
   assigning the clusters initial coordinates in the floorplan,
   calculating initial coordinates for wires connecting the clusters,
   calculating initial coordinates for modules based on clusters coordinates,
   recalculating cluster coordinates based on wire coordinates and module coordinates, and
   for each module:
   iteratively recalculating wire coordinates and module coordinates based on existing cluster coordinates and cluster coordinates based on recalculated wire and module coordinates,
   moving the clusters in the floorplan for more uniform density,
   assigning the modules to regions based on module coordinates,
   iteratively recalculating wire coordinates and module coordinates based on existing cluster coordinates and cluster coordinates based on recalculated wire and module coordinates,
   if the coordinates of a cluster belonging to a module are not in the region to which the module is assigned, changing the coordinates of that cluster to within the assigned region,
   moving the clusters in the floorplan for more uniform density,
   iteratively recalculating wire coordinates and module coordinates based on existing cluster coordinates and cluster coordinates for clusters not belonging to the module,
   moving the clusters in the floorplan for more uniform density, and
   assigning the modules to regions based on module coordinates.

12. A computer useable medium having a computer readable program embodied therein for addressing data to place cells into an integrated circuit floorplan, the computer readable program comprising:
   first computer readable program code for causing the computer to create clusters of cells in modules such that each cluster comprises cells in a path connected to at least one flip-flop in the module, or of cells that are not in a path connected to any flip-flop;
   second computer readable program code for causing the computer to define regions of the floorplan for placement of modules; and
   third computer readable program code for causing the computer to place the clusters into locations in modules, place the modules into locations in the regions, and selectively recalculate coordinates for clusters based on wire and module coordinates, comprising:
   calculating a cluster penalty based on a square distance between a cluster's coordinates and its module's coordinates, and
   recalculating cluster coordinates based on the existing cluster and module coordinates, the cluster penalty, a delay associated with each wire connected to the cluster and that wire's coordinates.

13. The computer useable medium of claim 12, wherein the third computer readable program code further comprises:
   computer readable program code for causing the computer to selectively recalculate coordinates for wires connecting the clusters and for modules based on clusters coordinates, and for clusters based on wire and module coordinates, computer readable program code for causing the computer to move clusters in the floorplan for more uniform density, and computer readable program code for causing the computer to assign the modules to regions based on module coordinates.

14. The computer useable medium of claim 13, wherein the computer readable program code for causing the computer to recalculate wire coordinates executes the following relationship q times $$x = \frac{1}{q}\sum_{i=1}^{q} x_i; \quad y = \frac{1}{q}\sum_{i=1}^{q} y_i,$$

where (x,y) are the recalculated wire coordinates, q is the number of I/O cells, megacells and clusters connected to the wire and $(X_i, y_i)$ are the coordinates of the respective I/O cells, megacells and clusters connected to the wire.

15. The computer useable medium of claim 13, wherein the computer readable program code for causing the computer to recalculate module coordinates executes the following relationship k times $$x = \frac{1}{k}\sum_{i=1}^{k} x_i; \quad y = \frac{1}{k}\sum_{i=1}^{k} y_i,$$

where (x,y) are the recalculated module coordinates, k is the number of clusters belonging to the module and $(x_i, y_i)$ are the coordinates of respective clusters belonging to the module.

16. The computer useable medium of claim 12, wherein the computer readable program code for causing the computer to calculate a penalty for a cluster under consideration causes the computer to calculate a ratio of the square distance, $D_{ij}$, between that cluster's coordinates and the module's coordinates and a maximal square distance, $D_j = \max D_{ij}$, a cluster with maximal square distance to the module's coordinates.

17. A process of placing cells into an integrated circuit floorplan comprising steps of:
a) creating clusters of cells in modules, each cluster comprising cells in a path connected to at least one flip-flop in the module, or of cells that are not in a path connected to any flip-flop;
b) defining regions of the floorplan for placement of modules; and
c) placing the clusters into locations in modules and placing the modules into locations in the regions by:

assigning the clusters initial coordinates in the floorplan, calculating initial coordinates for wires connecting the clusters, calculating initial coordinates for modules based on clusters coordinates, recalculating cluster coordinates based on wire coordinates and module coordinates, and for each module:

iteratively recalculating wire coordinates and module coordinates based on existing cluster coordinates and cluster coordinates based on recalculated wire and module coordinates, moving the clusters in the floorplan for more uniform density, assigning the modules to regions based on module coordinates, iteratively recalculating wire coordinates and module coordinates based on existing cluster coordinates and cluster coordinates based on recalculated wire and module coordinates, if the coordinates of a cluster belonging to a module are not in the region to which the module is assigned, changing the coordinates of that cluster to within the assigned region, moving the clusters in the floorplan for more uniform density, iteratively recalculating wire coordinates and module coordinates based on existing cluster coordinates and cluster coordinates for clusters not belonging to the module, moving the clusters in the floorplan for more uniform density, and assigning the modules to regions based on module coordinates.

18. The process of claim 17, wherein the step of recalculating cluster coordinates is performed by:

calculating a cluster penalty based on a square distance between a cluster's coordinates and its module's coordinates; and recalculating cluster coordinates based on the existing cluster and module coordinates, the cluster penalty, a delay associated with each wire connected to the cluster and that wire's coordinates.

* * * * *